United States Patent

Byers

[11] 4,116,694
[45] Sep. 26, 1978

[54] COLOR SEPARATED FILM STRIP TYPE FONT

[76] Inventor: Thomas L. Byers, 3004 SE. 21, Oklahoma City, Okla. 73115

[21] Appl. No.: 780,631

[22] Filed: Mar. 23, 1977

[51] Int. Cl.² .................... G03C 5/04; G03B 15/00
[52] U.S. Cl. .............................. 96/41; 96/42; 96/43; 354/292
[58] Field of Search ............ 96/41, 43, 42, 78, 87; 354/292

[56] References Cited

U.S. PATENT DOCUMENTS

| | | |
|---|---|---|
| 2,105,555 | 1/1938 | Ish-Shatom et al. ............ 354/292 |
| 3,099,089 | 7/1963 | Bond et al. ..................... 96/43 |
| 3,902,901 | 9/1975 | Vogel ............................. 96/42 X |

Primary Examiner—Edward C. Kimlin
Assistant Examiner—Alfonso T. Suro Pico
Attorney, Agent, or Firm—Robert K. Rhea

[57] ABSTRACT

A method of preparing color separated components and characters of a film strip type font in registration for photo composition. Positive proofs of the characters of a type font adaptable for multicolor printing are arranged in linear spaced relation. An overlay strip is formed for each supplementary color component of the type font characters to be printed. The several linear strips are arranged on a flat plane in superposed identically spaced parallel relation. A single negative film strip is formed from the assembled character and component strips for contact printing on photo sensitive paper of selected characters and components on the negative film.

2 Claims, 4 Drawing Figures

COLOR SEPARATED FILM STRIP TYPE FONT

BACKGROUND OF THE INVENTION

1. Field of the Invention

The present invention relates to graphic design and more particularly to a method of preparing camera ready commercial art containing type font characters to be printed in color.

In preparing camera ready advertising layouts, or the like, containing characters of a type font to be printed in color it has been the practice to prepare overlays of the supplemntal components of each type font character, to be printed in color, by hand cutting a peel-away section of film to leave only that portion of the film on the sheet for photoengraving and printing the colors of the respective characters. Obviously, this is a time consuming task requiring considerable skill on the part of the artist in making the color separation overlay so that one or more color plates will register with the respective characters.

2. Description of the Prior Art

It is well known in graphic arts to use commercial dry transfer sheets containing characters of the alphabet to form cuts or headings on artwork ready for photoengraving or photography. One advantage of the dry transfer sheets is that the spacing between the characters, both linear and vertically with respect to a reference line, may be adjusted by the artist to achieve balance or a desired effect, however, if the characters are to be printed in color, it has heretofor been necessary, to obtain color registration, to manually cut or form overlay sheets of the supplemental component of each character to be printed in color. Since this procedure is a time consuming and tedious task, the characters to be printed in one or more colors is generally limited to titles, headings, or the like. One example of forming registerable color separations of the characters of a type font is disclosed by U.S. Pat. No. 2,105,555 which utilizes the matrix of a keyboard-operated type setting machine, or the like, in which the respective matrix contains the outline of the respective character and a color component so that a selected series of the matrix forms a word or words to be photographically reproduced for subsequent printing in a conventional manner. The principal disadvantage of the use of such matrix for color separation is that the spacing between the characters forming a word can not be adjusted to decrease the spacing between any two characters, to achieve a desired balance, less than the physical thickness of the matrix portions between two or more characters on juxtaposed matrixes.

It is also known to form a negative film strip of the characters of a type font, the characters being arranged linearly on an elongated strip of film or on an endless circular strip of film, such as disclosed by U.S. Pat. No. 3,821,770. The linear or circular strip of film may be used by either manually or by a photocomposing machine in successively exposing selected characters of the type font on photographic paper to obtain the desired message and subsequent photoengraving. Such film strips increase the versatility of composing camera ready artwork, however, if the characters printed from the film strip are to be reproduced partially in color it becomes necessary to manually cut overlay strips containing the color separated components of the respective character.

This invention overcomes the above disadvantages by forming a film strip of a linear arranged type font which contains at least one superposed strip of supplemental color components of each character for accurate registration when printing the characters in more than one color.

SUMMARY OF THE INVENTION

A positive proof of a selected type font arranged in linear form, with register marks at least at the respective ends thereof, is modified in any well known manner to design supplemental components of the characters of the type font to be printed as background or shaded areas in color. A color separation overlay, including cooperating register marks, is prepared for each of the color components of respective characters. The positive proof of the type font and each of the strips of color separated overlays are arranged in a flat plane in superposed parallel relation. A negative film strip is then made of the type font and color separation overlays. A strip of positive film of the positive proof of the type font is formed integral with the negative film and coextensive with one longitudinal edge thereof which serves as a guide in spacing between the characters of the type font when printing words or the characters forming words. The negative film strip is contact printed by simultaneously exposing selected characters of the type font and the respective color separated components thereof to form a message. The resulting contact print when developed is used in combination with a graphic design to form camera ready artwork or for photoengraving. Obviously, the type font and its color separated components may be arranged on an endless section of circular film for use in mechanical, optical or coded composing machines for spacing between the selected characters and words wherein the predetermined vertical spacing between the base characters and the color separated components on the film strip remain constant to insure accurate registration of the color components when printing cuts or lithographic plates formed therefrom.

The principal object of this invention is to provide negative film strips of type fonts having color separation components of each character thereon in identically spaced superposed relation with respect to each character for accurate printing registration of photoengraved color plates with base plates.

BACKGROUND OF THE PREFERRED EMBODIMENTS

Figure 1:
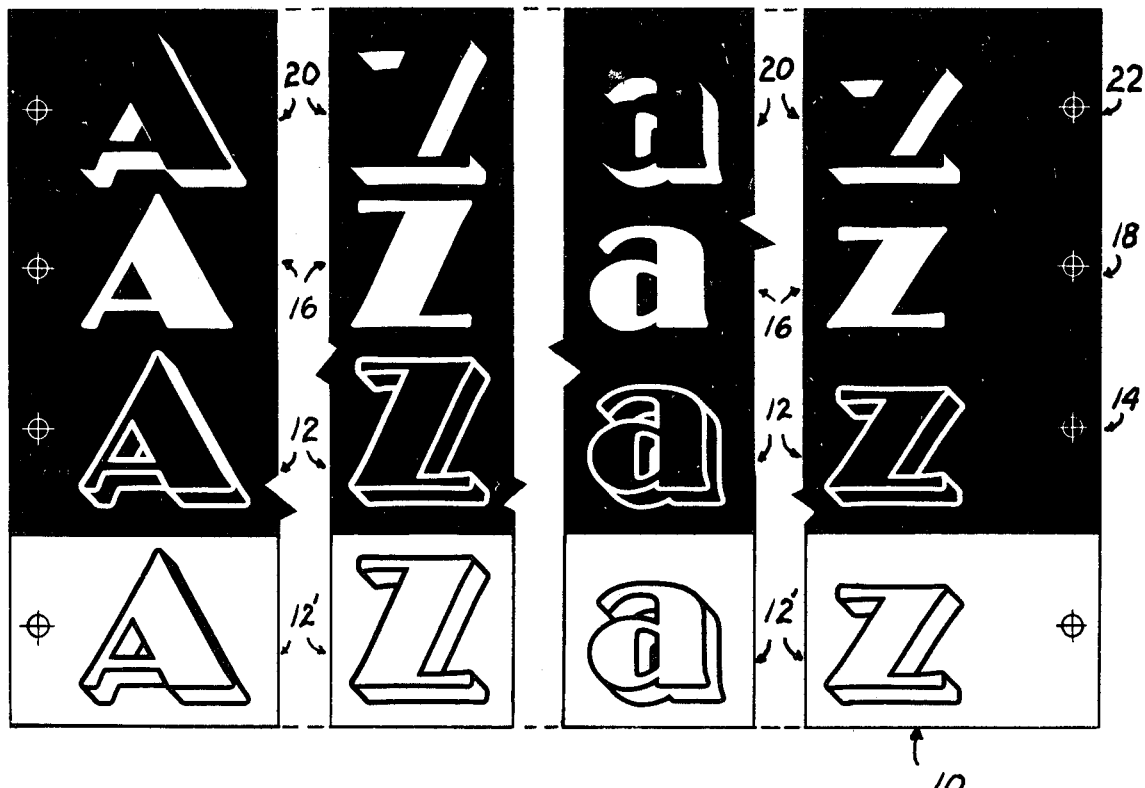
FIG. 1 is a fragmentary plan view of a linear strip of negative film containing upper and lower case characters of an outline character type font and its color separated components and including an integral strip of positive film containing the outline characters.

Like characters of reference designate like parts in those figures of the drawings in which they occur.

In the drawings:

In carrying out the invention, a type font is selected, preferably using both upper and lower case characters, which are modified manually or by using any known graphic modifier of type fonts, for example, my U.S. Pat. No. 3,927,942.

The reference numeral 10 indicates a combination negative and positive film strip formed according to the invention by using outline characters of a type font which have been modified to provide shade areas for each character to be printed in color. The outline characters 12 may be hand drawn or obtained from any one of the commercially available conventional sheets of film containing dry transfer characters of a type font. The characters 12 are arranged in spaced-apart side by side linear fashion with the upper and lower case of the characters forming a progressive longitudinal series having register marks 14 at least at the respective ends thereof. To obtain the film strip 10 an overlay is formed, as by hand cutting a film to form a camera reproducible strip 16 of background area of each character similarly having register marks 18. Similarly, a second overlay is hand cut of each character of the font to form a camera reproducible strip 20 of the shadow area of each of the characters including register marks 22. The two overlays 16 and 20, each containing the register marks 18 and 22, at least at the respective end thereof, registrable with the register marks 14 of the outline characters, are arranged in a common plane in superposed spaced parallel relation with respect to the base character strip 12. A negative film strip, formed from the linear arranged outline characters 12, is similarly disposed adjacent the outline characters. The combination negative and positive film strip 10 is photographically produced from the superposed strips of outline characters and color separated components wherein the negative portion of the film strip contains transparent areas defining the outline characters 12 and the color separated components 16 and 20 including the respective register marks at the ends thereof. The positive portion of the film contains opaque areas defining outline characters 12' to serve as a spacing guide between adjacent characters, as presently explained.

Figure 2:
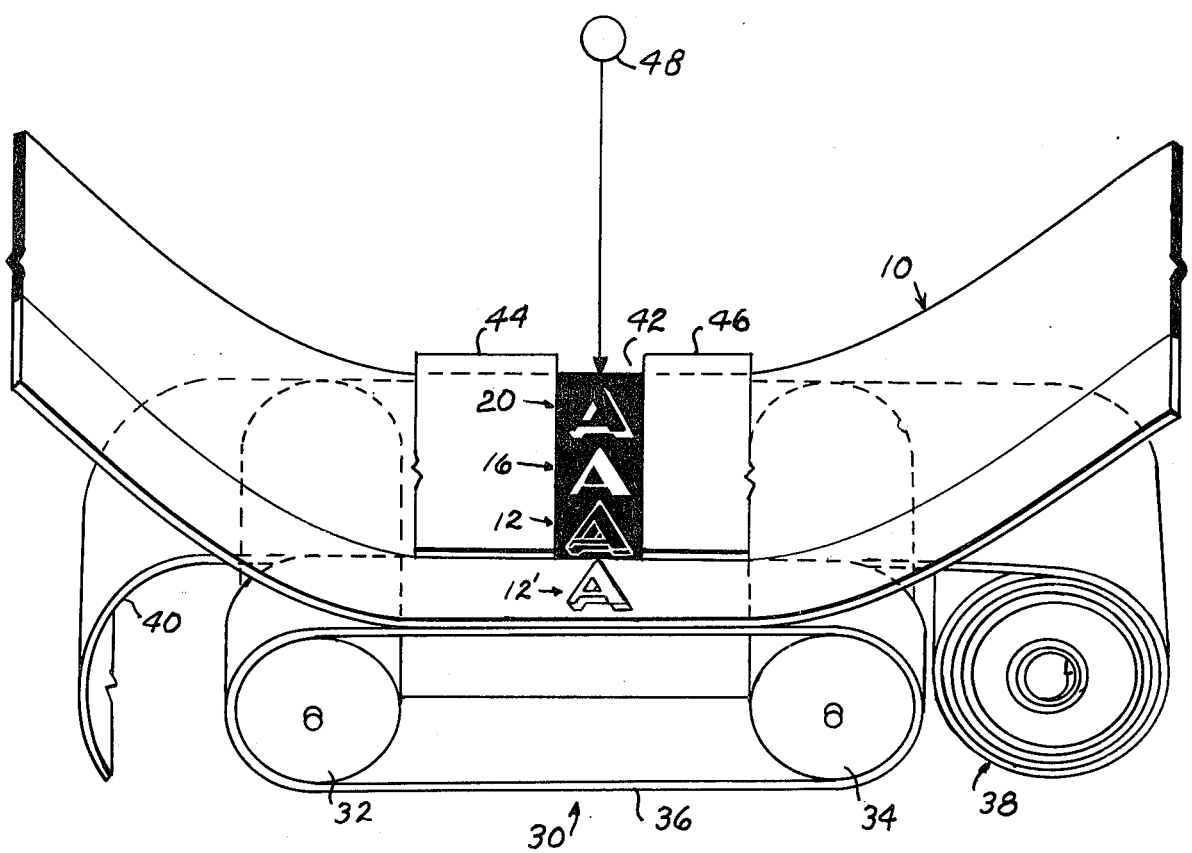
FIG. 2 is a diagrammatic view illustrating one manner of printing one character and its color separated components of the film strip of FIG. 1, other characters being omitted from the film strip for clarity.

Referring also to FIG. 2, the numeral 30 diagrammatically indicates a film strip printing apparatus comprising a pair of spaced-apart parallel rollers 32 and 34 having an endless beltlike band 36 having a phosphorescent coating or film on its outwardly disposed surface entrained around one end portion of the respective roller. The rollers are disposed within and journalled by a surrounding housing, not shown, for excluding light for the reasons readily apparent.

A roll or strip of photographic paper 38, having a photographically sensitive surface, is disposed adjacent one of the rollers, for example the roller 34, so that one end portion 40 of the photographic paper extends horizontally across the upper peripheral limit of the rollers 32 and 34 in juxtaposed relation with respect to the band 36. The combined transverse width of the photographic paper end portion 40 and the endless band 36 is at least equal to the transverse width of the film strip 10 for the reasons readily apparent.

Figure 3:
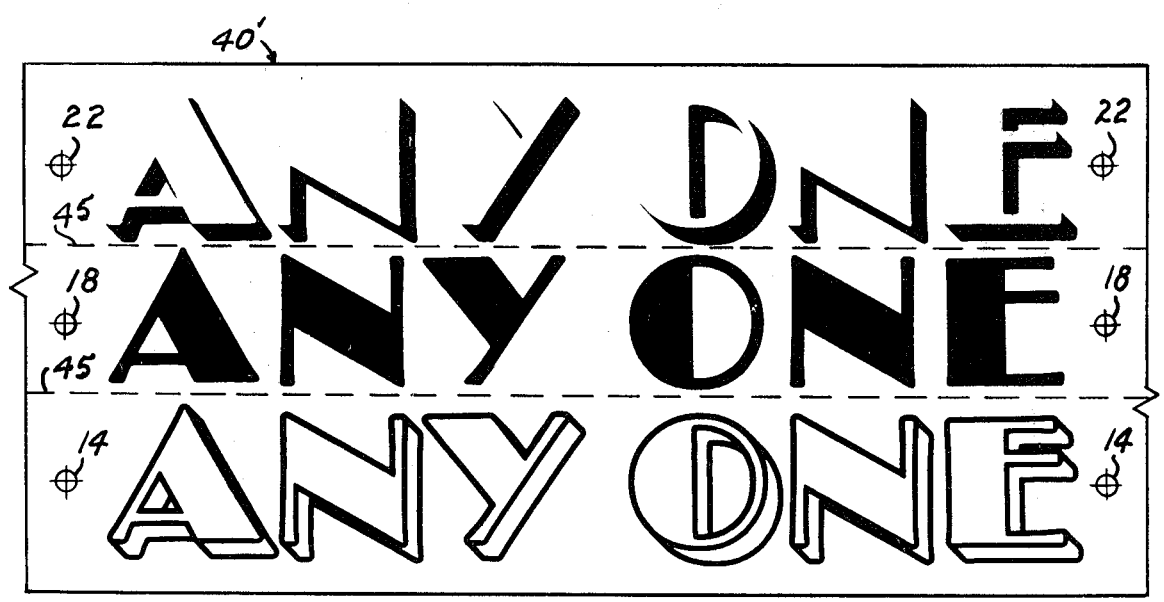
FIG. 3 is a fragmentary plan view of a contact print produced from the film strip; and, FIG. 4 illustrates the character A printed in color by photoengraving plates obtained from the contact print of FIG. 3.

A gate or opening 42, extending transversely of the paper strip 40 and band 36, between the rollers 32 and 34, is defined by spaced-apart light excluding housing plates 44 and 46. The film strip 10 longitudinally slidably contacts the upwardly disposed photosensitive surface of the paper strip 40 and endless band 36 below the plates 44 and 46. The film strip 10 is manually positioned so that a selected character, for example the character A, is disposed within the opening 42 and a source of light, indicated at 48, is energized a selected duration of time for photographically exposing the character A and its color separated components defined by the film strip 10. With the light source 48 turned off the paper strip 40 and endless band 36 are simultaneously moved, as by rotating the rollers 32 and 34 toward the left, as viewed in FIG. 2, to position the exposed position of the character A on the paper strip 40 beneath the plate 44. The positive film character A, as a result of exposure to the light 48, remains visible on the band 36 to indicate the position of the previously exposed plate covered position of the character A on the paper strip 40 so that the film strip 10 may be manually shifted longitudinally, in either direction with respect to the paper strip 40 and the opening 42, to position the next selected character of the film strip 10 in position for exposure through the opening 42, for example the letter N (FIG. 3). The spacing between the letter N and the position of the previously printed letter A, longitudinally of the paper strip 40, is determined by the position of the residual impression of the letter A on the endless band 36 and the position of the character N on the positive portion of the film 10.

Additional characters are selected and photographically exposed on the paper strip 40 in a similar manner according to the requirements of the message to be obtained from the film strip 10 in which any one of the upper or lower case characters of the film strip type font may be used repeatedly as desired. Similarly the register marks 14, 18 and 22 are exposed on the paper strip 40 at the respective ends of the message (FIG. 3). Film guides, now shown, forming a part of the strip printer 30, normally guide the film strip 10 in its longitudinal movement so that characters printed therefrom are in linear alignment, however, in the event the film strip is inadvertently moved, transversely of the print paper 40, prior to exposing one of the characters and its color components on the film strip 10, the resulting printed character and its separated color components will be in register on printing plates made therefrom by reason of the vertically aligned spacing between each character on the film strip and its color separated components remaining constant. Stated another way, in the event any character of a word is slightly displaced, either above or below the vertical limits of a word or line of characters, the color forming components of that character will similarly be out of alignment the exact distance its base or outline letter is out of alignment thus assuring accurate registration when subsequently printing one color over another.

Figure 4:
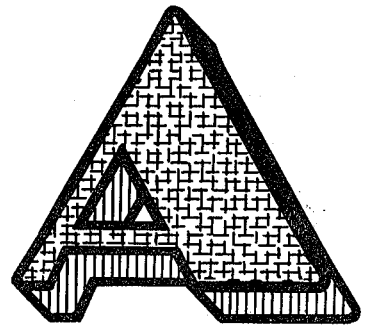

An example of words exposed on the paper strip 40 from the film strip 10 and developed in a conventional manner is shown at 40' (FIG. 3) which is used for photoengraving to form a plurality of cuts or plates, one for each longitudinal row of the outline letters and two colors to be overprinted thereon. Register marks, at the respective ends of the words and the color plates, are used for registering the respective plates during final printing, such as illustrated in FIG. 4, in which the open area or background is printed in yellow with the shading of the character printed in red, the colors being indicated by color shading.

When the developed paper strip 40' is to be used as a portion of a graphic design the paper strip 40' is longitudinally divided, between the words, as by cutting along the dotted lines 45. The three strips of words and color components are then registered with each other on the graphic design and its color overlays.

Obviously the invention is susceptible to changes or alterations without defeating its practicability. Therefore, I do not wish to be confined to the preferred embodiment shown in the drawings and described herein.

I claim:

1. A method of preparing a plurality of camera ready positive proof strips having printing registered type font characters and color separated components, comprising:
   a. providing a positive print strip of juxtaposed characters of a complete type font;
   b. preparing an overlay strip containing supplemental color printing components for each character of the type font;
   c. arranging said positive print strip and each said overlay strip in a common plane in superposed spaced-apart parallel relation;
   d. photographically producing a single negative photographic transparency strip containing the superposed positive print strip and each overlay strip;
   e. successively contact printing an elongated message forming strip of selected characters and their respective color components of the negative transparency; and,
   f. longitudinally dividing the contact printed strip to form a plurality of camera ready strips containing the selected characters and their color components, respectively.

2. A method of preparing a film strip type font having separated color printing components, comprising:
   a. providing a positive print strip of juxtaposed characters of a complete type font;
   b. preparing an overlay strip containing supplemental color printing components for each character of the type font;
   c. arranging said positive print strip and each said overlay strip in a common plane in superposed spaced-apart parallel relation; and,
   d. photographically producing a single negative photographic transparency strip containing the superposed positive print strip and each overlay strip.

* * * * *